United States Patent [19]
Ishikawa

[11] Patent Number: 5,882,975
[45] Date of Patent: Mar. 16, 1999

[54] METHOD OF FABRICATING SALICIDE-STRUCTURE SEMICONDUCTOR DEVICE

[75] Inventor: Hiraku Ishikawa, Tokyo, Japan

[73] Assignee: NEC Corporation, Japan

[21] Appl. No.: 711,914

[22] Filed: Sep. 12, 1996

[30] Foreign Application Priority Data

Sep. 28, 1995 [JP] Japan .................................. 7-273689

[51] Int. Cl.⁶ .................................................. H01L 21/335
[52] U.S. Cl. ........................ 438/303; 438/586; 438/595; 438/683; 438/695; 438/720; 438/788
[58] Field of Search .................................... 438/301, 303, 438/586, 592, 595, 682, 683, 759, 787, 788, 695, 707, 710, 720, 721

[56] References Cited

U.S. PATENT DOCUMENTS

| | | | |
|---|---|---|---|
| 5,089,442 | 2/1992 | Olmer ..................................... | 438/631 |
| 5,419,805 | 5/1995 | Jolly ........................................ | 438/715 |
| 5,573,961 | 11/1996 | Hsu et al. .............................. | 438/163 |
| 5,679,606 | 10/1997 | Wang et al. ............................ | 438/763 |

FOREIGN PATENT DOCUMENTS 4-34933  2/1992  Japan .
7-99171  4/1995  Japan .

*Primary Examiner*—T. N. Quach
*Attorney, Agent, or Firm*—Hayes, Soloway, Hennessey, Grossman & Hage, P.C.

[57] ABSTRACT

The method of fabricating a semiconductor device includes the steps of (a) forming a metal film over a semiconductor substrate including a gate electrode on a surface thereof, an insulating sidewall covering a side surface of the gate electrode therewith, and source and drain regions formed therein, (b) forming a metal silicide film both on the gate electrode and the source and drain regions by thermally treating the semiconductor substrate to cause the metal film to react with silicon, and (c) etching out a non-silicided portion of the metal film, and further includes the step of (d) removing a portion of the non-silicided portion remaining non-etched or the metal film, by means of plasma-enhanced chemical vapor deposition. The step (d) may be carried out between the steps (a) and (b), between the steps (b) and (c), or after the step (c). The method is applied to a salicide structure semiconductor device, and makes it possible to completely remove a metal film or a metal silicide film formed on a sidewall by virtue of etching performance of plasma-enhanced CVD to thereby prevent occurrence of short-circuit between a gate electrode and source/drain regions without causing reduction in a thickness of a silicide film and side-etching of a silicide film.

20 Claims, 9 Drawing Sheets

METHOD OF FABRICATING SALICIDE-STRUCTURE SEMICONDUCTOR DEVICE

BACKGROUND OF THE INVENTION

1. Field of the Invention

The invention relates to a method of fabricating a semiconductor device, and more particularly to a method of fabricating a transistor having silicide films formed both on source/drain regions and a gate electrode in self-aligned fashion, namely a transistor having a self-aligned silicide (salicide) structure.

2. Description of the Related Art

With demands in reduction in size and high integration of a semiconductor device, a gate electrode has been more and more reduced in both size and thickness, and source and drain regions have been made to have a shallower junction depth. This causes a gate wiring to have a greater resistance, and also causes source and drain regions to have a greater sheet resistance. In addition, higher integration of a semiconductor device causes a longer wire length, and, on the other hand, a semiconductor device is demanded to operate at higher speed. As a result, it is no longer possible for a conventional polysilicon gate electrode to provide a semiconductor device having desired performances.

In order to solve such a problem, there has been suggested and used a salicide (self-aligned silicide) structure in which there are formed metal silicide films such as titanium silicide are formed both on a polysilicon gate electrode and source/drain regions of a transistor in self-aligned fashion to thereby reduce resistance of a gate electrode and source/drain regions.

However, the above mentioned salicide structure poses a problem that a silicon dioxide film reacts with titanium on a sidewall to thereby produce titanium, though in a quite small amount, to thereby cause short-circuits between a gate electrode and source/drain regions.

As a countermeasure to the problem, Japanese Unexamined Patent Publication No. 4-34933 has suggested carrying out wet etching for removal of a portion at which the short-circuits is to take place. Hereinbelow will be explained the method suggested in the above mentioned Publication, with reference to FIGS. 1A to 1D which are cross-sectional views showing respective step of the method.

As illustrated in Fig. 1A, a gate polysilicon film 3 is formed on a silicon substrate 1 with a gate insulating film 2 sandwiched therebetween, and then a sidewall 5 is formed around a side surface of the gate polysilicon film 3. The sidewall 5 is made of insulating material. The silicon substrate 1 has source and drain regions 4 therein a part of which is in exposure to atmosphere. A resultant is entirely covered with a titanium film 6 by sputtering or evaporation.

Then, the semiconductor substrate 1 is thermally treated to thereby form titanium silicide films 7 on both the gate polysilicon film 3 and the source and drain regions 4, as illustrated in FIG. 1B.

Then, non-reacted portions 6a of the titanium film 6 are etched for removal by using an etchant such as a mixture solution of $H_2SO_4$ and $H_2O_2$ which removes titanium in titanium silicide with great etching selectivity. Regardless of this etching, portions 7a of the titanium silicide film 7, though in a quite small amount, remain non-etched on the sidewall 5, as illustrated in Fig. 1C.

Thereafter, the portions 7a of the titanium silicide film 7 are removed by using an etchant such as a mixture solution of $NH_4OH$ and $H_2O_2$ which removes titanium in titanium silicide with small etching selectivity. Thus, the titanium silicide having been formed on the sidewall is removed, and hence it is possible to prevent occurrence of short-circuits between the gate electrode 3 and the source and drain regions 4.

However, the above mentioned method suggested in Japanese Unexamined Patent Publication No. 4-34933 has two problems as follows: one of them is that titanium silicide films formed on both the gate polysilicon film and the source and drain regions are also etched out simultaneously with the removal of the titanium silicide film remaining non-etched on the sidewall, resulting in an increase in a resistance in the gate electrode and the source and drain regions; the other is that a resistance would be further increased in the gate electrode and the source and drain regions, since interfaces between the titanium silicide film and the gate polysilicon film and also between the titanium silicide film and the silicon substrate are side-etched.

For another example, Japanese Unexamined Patent Publication No. 7-99171 has suggested a method of fabricating a MOS transistor which method is capable of decreasing a sheet resistance without occurrence of bridging. This method includes the steps of forming a gate electrode on a silicon substrate, forming source and drain diffusion layers, depositing a titanium film all over a resultant and thermally treat the resultant to thereby form $TiSi_2$ layers, and selectively removing non-reacted titanium and titanium compounds other than $TiSi_2$ by using a mixture solution of $H_2O_2$ and $H_2SO_4$ ($H_2O_2$:$H_2SO_4$=1:1).

However, this method has the same problems as those of the first mentioned prior method, namely the above mentioned two problems.

SUMMARY OF THE INVENTION

It is an object of the present invention to provide a method by which it is possible to completely remove a titanium film or a titanium silicide film on a sidewall without increasing resistances in a gate electrode and/or source and drain regions.

The present invention provides a method of fabricating a semiconductor device, including the steps, in sequence, of (a) forming a metal film over a semiconductor substrate including a gate electrode on a surface thereof, an insulating sidewall covering a side surface of the gate electrode therewith, and source and drain regions formed therein, (b) forming a metal silicide film both on the gate electrode and the source and drain regions by thermally treating the semiconductor substrate to cause the metal film to react with silicon, (c) etching out a non-silicided portion of the metal film, and (d) removing a portion of the non-silicided portion remaining non-etched on the sidewall in the step (c), by means of plasma-enhanced chemical vapor deposition.

The present invention further provides a method of fabricating a semiconductor device, including the steps, in sequence, of (a) forming a metal film over a semiconductor substrate including a gate electrode on a surface thereof, an insulating sidewall covering a side surface of the gate electrode therewith, and source and drain regions formed therein, (b) removing a portion of the metal film formed on the sidewall by means of plasma-enhanced chemical vapor deposition, and (c) forming a metal silicide film both on the gate electrode and the source and drain regions by thermally treating the semiconductor substrate to cause the metal film to react with silicon.

The step of etching out a non-silicided portion of the metal film may be carried out subsequently to the step (c).

The present invention still further provides a method of fabricating a semiconductor device, including the steps, in sequence, of (a) forming a metal film over a semiconductor substrate including a gate electrode on a surface thereof, an insulating sidewall covering a side surface of the gate electrode therewith, and source and drain regions formed therein, (b) forming a metal silicide film both on the gate electrode and the source and drain regions by thermally treating the semiconductor substrate to cause the metal film to react with silicon, and (c) removing a non-silicided portion of the metal film situated on the sidewall by means of plasma-enhanced chemical vapor deposition.

The step of etching out a non-silicided portion of the metal film may be carried out subsequently to the step (c).

For instance, the metal film is made of titanium (Ti), tantalum (Ta), molybdenum (Mo), or tungsten (W).

There may be formed silicon dioxide films both on the gate electrode and the source and drain regions by carrying out the plasma-enhanced chemical vapor deposition.

It is preferable that high frequency electric field is applied to the semiconductor substrate during the plasma-enhanced chemical vapor deposition. As the plasma-enhanced chemical vapor deposition, there may be carried out electron cyclotron resonance chemical vapor deposition (ECR-CVD) for applying micro-waves to the semiconductor substrate.

It is preferable to use an inert gas such as argon (Ar) gas as well as process gases for the plasma-enhanced chemical vapor deposition.

In accordance with the present invention, electrically conductive films such as a titanium film and a titanium silicide film are removed by virtue of etching performance of plasma-enhanced chemical vapor deposition on an inclined surface, and hence it is possible to prevent short-circuits between a gate electrode and source/drain regions without causing reduction in a thickness of a silicide film and also without a silicide film being side-etched on a gate polysilicon film and source/drain diffusion regions.

In addition, by growing polysilicon on a metal film, it is possible to prevent impurities profile from being disordered by silicidation in a gate polysilicon film and source/drain diffusion layers.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
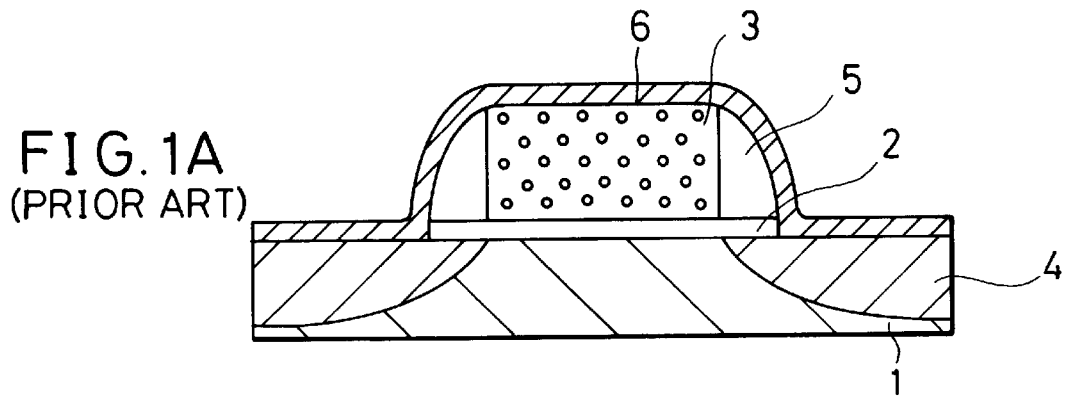
FIGS. 1A to 1D are cross-sectional views of a semiconductor device showing respective step of a prior method of fabricating a semiconductor device.
Figure 1B:
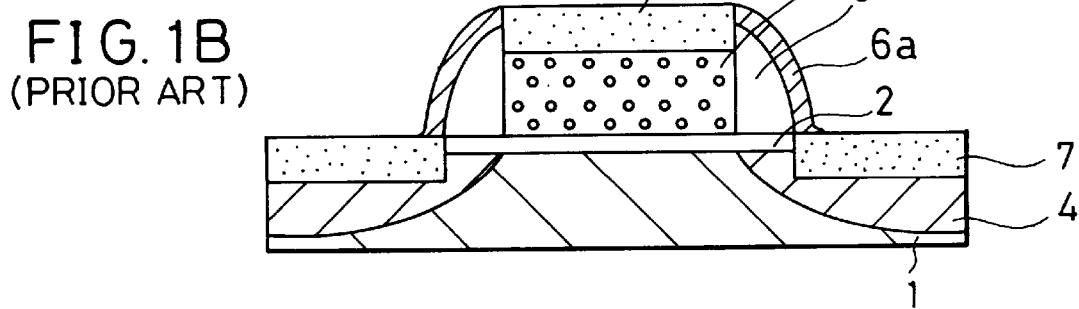
Figure 1C:
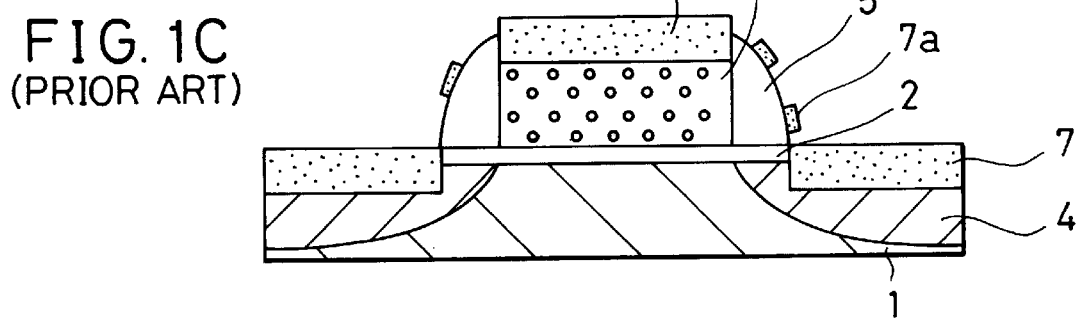
Figure 1D:
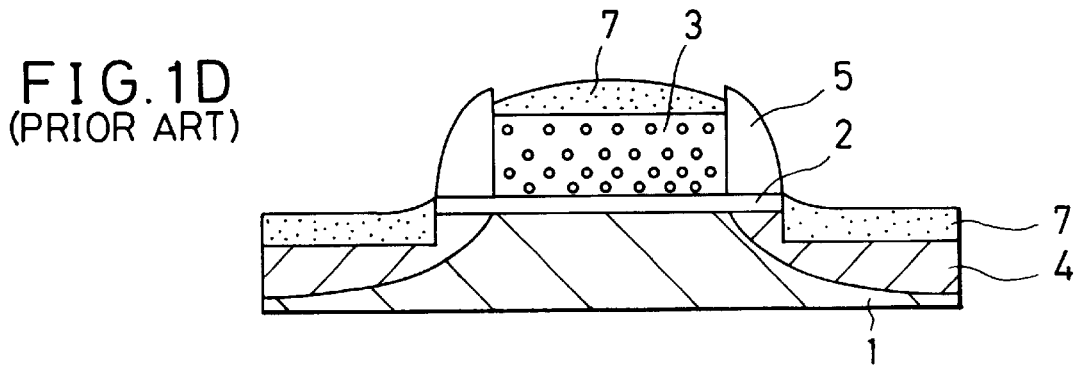

The first embodiment is described hereinbelow with reference to FIGS. 2A to 2D.

First, a gate polysilicon film 3 is formed on a silicon substrate 1 with a gate insulating film 2 sandwiched therebetween. Then, n-type impurities are ion-implanted into the silicon substrate 1 at a small dose to thereby form a diffusion layer having low impurity concentration. Then, a silicon dioxide film is deposited all over the silicon substrate 1 by means of chemical vapor deposition (hereinafter, referred to simply as CVD). The silicon dioxide film is etched back by anisotropic reactive ion etching (RIE) to thereby form a sidewall 5 around a side surface of the gate polysilicon film 3. Then, n-type impurities are ion-implanted into the silicon substrate 1 again to thereby form a diffusion layer having a high impurity concentration. The thus formed diffusion layer and the previously formed diffusion layer act as source and drain diffusion layers 4. The sidewall 5 electrically insulates the gate polysilicon film 3 from the source and drain diffusion layers 4.

Figure 2A:
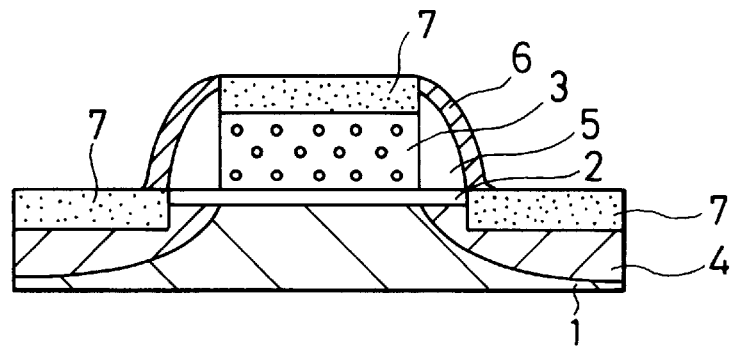
FIGS. 2A to 2D are cross-sectional views of a semiconductor device showing respective step of a method in accordance with the first embodiment of the present invention.

Then, a titanium film 6 is deposited all over a resultant by sputtering or CVD, followed by thermal treatment at about 750° C. to thereby selectively form titanium silicide films 7 only on the gate polysilicon film 3 and the source and drain diffusion layers 4, as illustrated in FIG. 2A.

Thereafter, excessive titanium which was not turned into titanium silicide is removed by wet etching using a mixture solution of $H_2SO_4$ and $H_2O_2$.

Figure 2B:
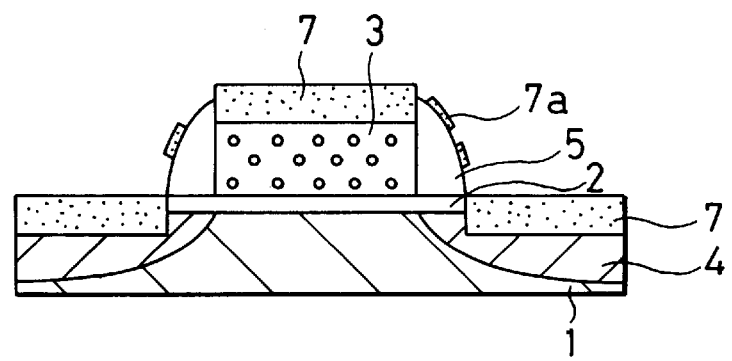

Regardless of the wet etching, portions 7a of the titanium silicide film 7, though in a quite small amount, remain non-etched on a surface of the sidewall 5, as illustrated in FIG. 2B.

Then, there is carried out electron cyclotron resonance type chemical vapor deposition (hereinafter, referred to simply as ECR-CVD), which is a sort of plasma-enhanced CVD, to thereby remove the titanium silicide portions 7a residual on the sidewall 5.

Figure 3:
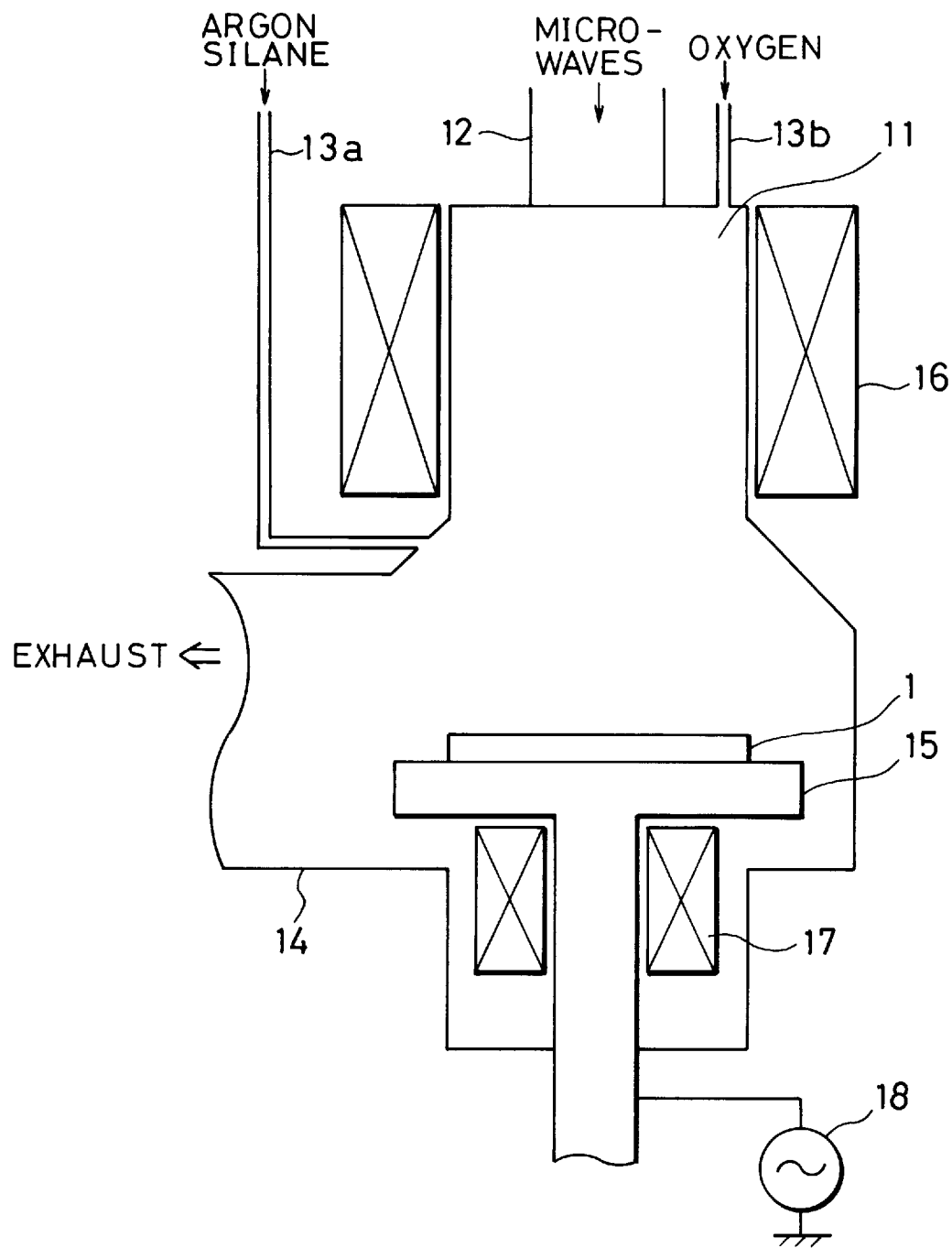
FIG. 3 is a cross-sectional view of a bias ECR-CVD apparatus which is to be used in the embodiments of the present invention.

FIG. 3 is a schematic view illustrating a bias ECR-CVD apparatus for applying high frequency bias to a substrate. As illustrated, the bias ECR-CVD apparatus includes a plasma chamber 11, and a micro-waves inlet 12 disposed just above the plasma chamber 11. Micro-waves are introduced into the plasma chamber 11 through the micro-waves inlet 12. The plasma chamber 11 is formed with gas inlets 13a, 13b and gas outlet 14. Process gases are introduced into the plasma chamber 11 through the gas inlets 13a, 13b, and exhausted through the gas outlet 14. In the plasma chamber 11, there stands a susceptor 15 on which the silicon substrate 1 to be processed is mounted.

A high frequency power supply 18 is in electrical connection with the susceptor 15, and applies high frequency bias to the susceptor 15. A main coil 16 is wound around the plasma chamber 11, and an auxiliary coil 17 is disposed just below the susceptor 15. These two coils 16 and 17 establish magnetic field in the plasma chamber 11.

As oxygen ($O_2$) gas is introduced into the plasma chamber 11 through the gas inlet 13a, micro-waves are also introduced into the plasma chamber 11 to thereby generate plasma. Then, argon gas together with silane gas is introduced into the plasma chamber 11 through the gas inlet 13b to thereby deposit a silicon dioxide film on the silicon substrate 1. At the same time, high frequency electric field is applied to the susceptor 15 to thereby carry out plasma-etching to the silicon substrate 1 with the argon gas.

Figure 4:
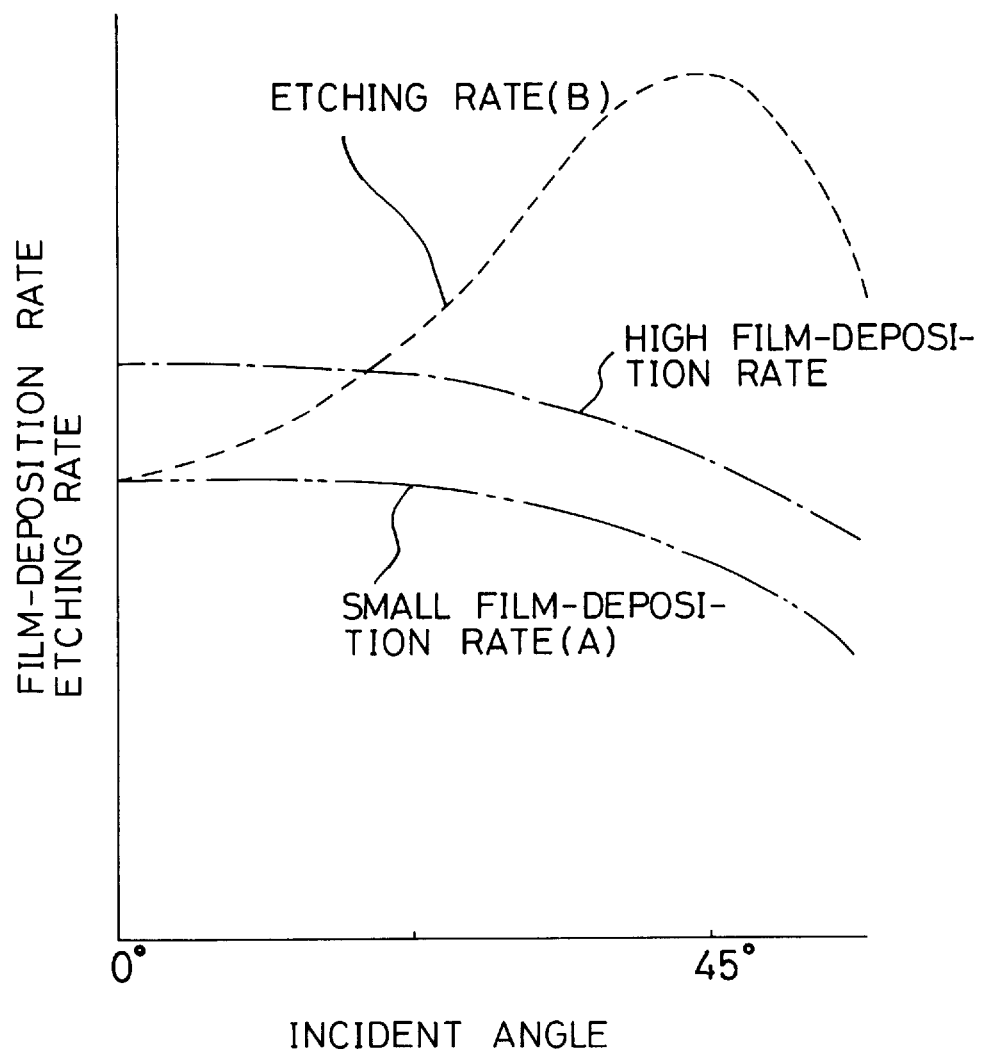
FIG. 4 is a graph showing the relationship between growth and etching rates and an incident angle to a substrate in bias ECR-CVD.
Figure 5:
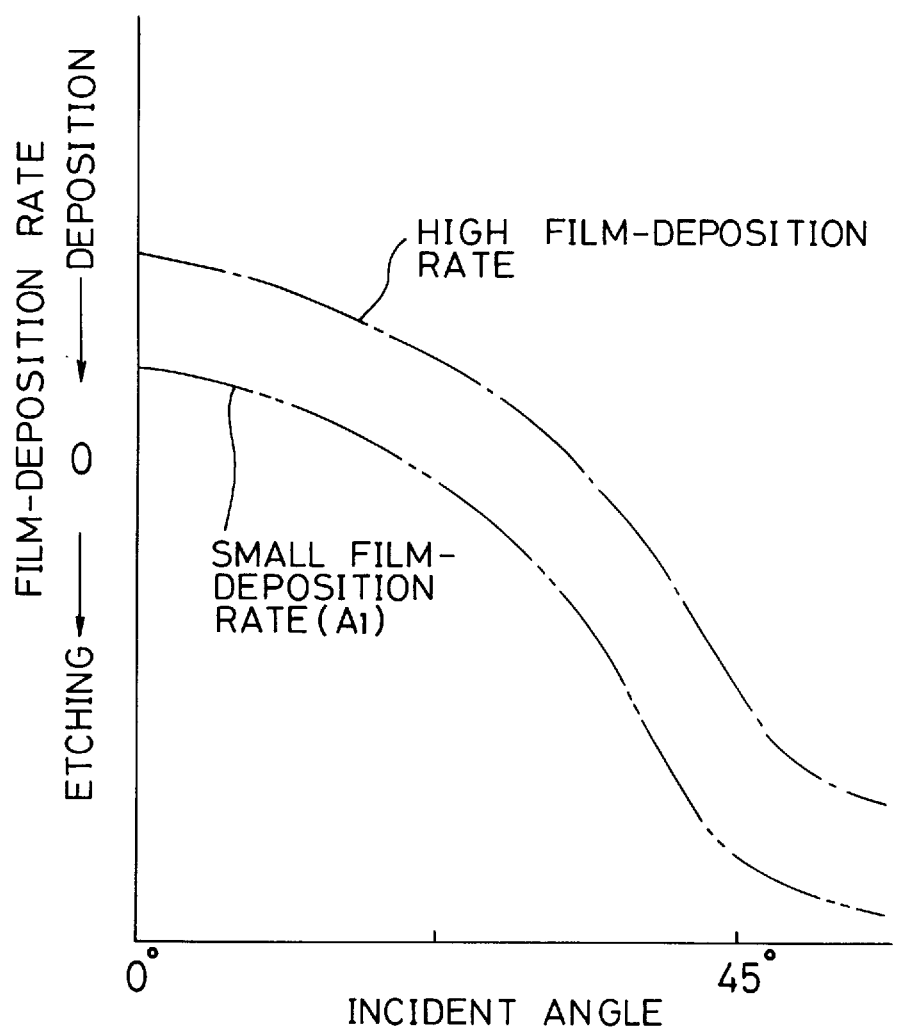
FIG. 5 is a graph showing the relationship between a growth rate and an incident angle to a substrate in bias ECR-CVD.

FIGS. 4 and 5 show the relation between film deposition rate and etching rate in bias ECR-CVD. In particular, FIGS. 4 independently shows film deposition rate and etching rate in bias ECR-CVD. Actually, the film deposition rate minus the etching rate makes a net growth rate, which is shown in FIG. 5. In FIGS. 4 and 5, 0° of an incident angle indicates flat portions of the silicon substrate 1, that is, upper surfaces of the gate polysilicon film 3 and the source/drain diffusion layers 4. In the first embodiment, the film deposition rate at the flat portions of the silicon substrate 1 is set to be equal to or slightly greater than the etching rate. In FIG. 4, a line A indicates a condition that the film deposition rate is equal to or slightly greater than the etching rate, indicated with a broken line B, at the flat portions of the silicon substrate.

As will be understood in view of a line $A_1$ in FIG. 5, etching never takes place at the flat portions (incident angle=0°) of the silicon substrate in this condition, and hence a silicon dioxide film is never deposited or only slightly deposited.

In the first embodiment, the etching rate is set to be greater than the film deposition rate at 45° of an incident angle, that is, at the sidewall 5. Hence, the titanium silicide films 7a located on the sidewall 5 are etched out. Specific film deposition conditions for bias ECR-CVD are as follows.

silane flow rate: 15 to 30 sccm oxygen flow rate: 23 to 45 sccm argon flow rate: 70 to 100 sccm micro-waves output: 2000 kW high frequency bias output: 1400 kW film deposition temperature: 300° to 350° C.

Under these conditions, the net film deposition rate at the flat portions of the silicon substrate is in the range of about 3000 to 0 angstroms/minute.

Figure 2C:
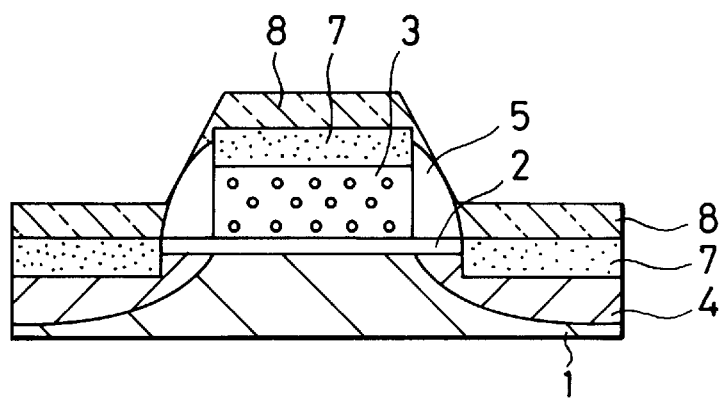
Figure 2D:
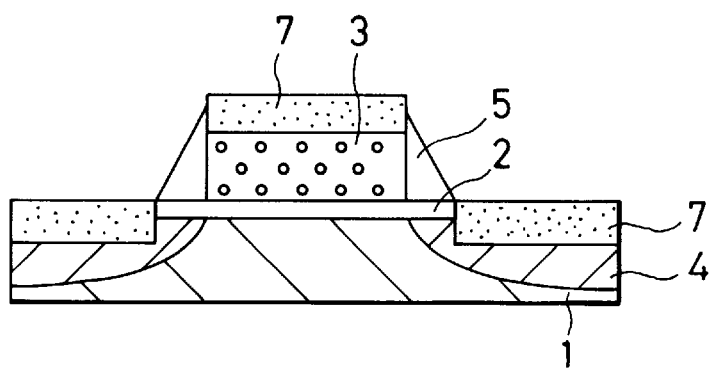

Thus, after the slight film deposition by bias ECR-CVD, when the film deposition rate is sufficiently high, etching is weakly carried out on the sidewall and there are formed the silicon dioxide films 8 on the flat portions of the silicon substrate 1 by bias ECR-CVD, as illustrated in FIG. 2C. On the other hand, when the film deposition rate is equal to zero, etching is relatively intensively carried out on the sidewall 5, and hence the silicon dioxide film on the sidewall 5 are etched out, as illustrated in FIG. 2D. Since the titanium silicide films 7a located on the sidewall 5 are removed in either case, it is possible to prevent occurrence of short-circuits between the gate polysilicon film 3 and the source/drain diffusion layers 4.

Hereinbelow will be explained the second embodiment of the present invention with reference to FIGS. 6A to 6D, 7A and 7B.

Figure 6A:
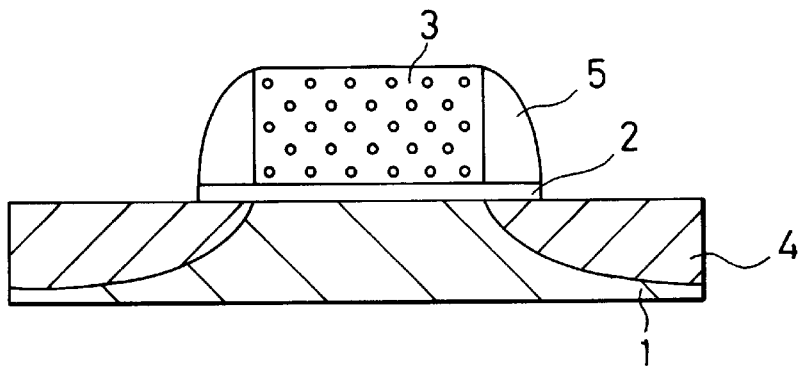
FIGS. 6A to 6D are cross-sectional views of a semiconductor device showing respective step of a method in accordance with the second embodiment of the present invention.

Similarly to the first embodiment, as illustrated in FIG. 6A, a gate polysilicon film 3 is first formed on a silicon substrate 1 with a gate insulating film 2 sandwiched therebetween. Then, n-type impurities are ion-implanted into the silicon substrate 1 at a small dose to thereby form a diffusion layer having low impurity concentration. Then, a silicon dioxide film is deposited all over the silicon substrate 1 by means of CVD. The silicon dioxide film is etched back by anisotropic RIE to thereby form a sidewall 5 around a side surface of the gate polysilicon film 3. Then, n-type impurities are ion-implanted into the silicon substrate 1 again to thereby form a diffusion layer having a high impurity concentration. The thus formed diffusion layer and the previously formed diffusion layer act as source and drain diffusion layers 4. The sidewall 5 electrically insulates the gate polysilicon film 3 from the source and drain diffusion layers 4.

Figure 6B:
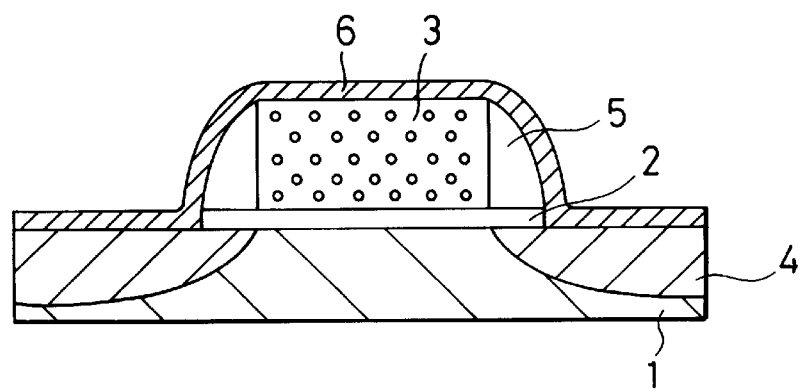

Then, a titanium film 6 is deposited all over a resultant by sputtering or CVD, as illustrated in FIG. 6B.

Figure 6C:
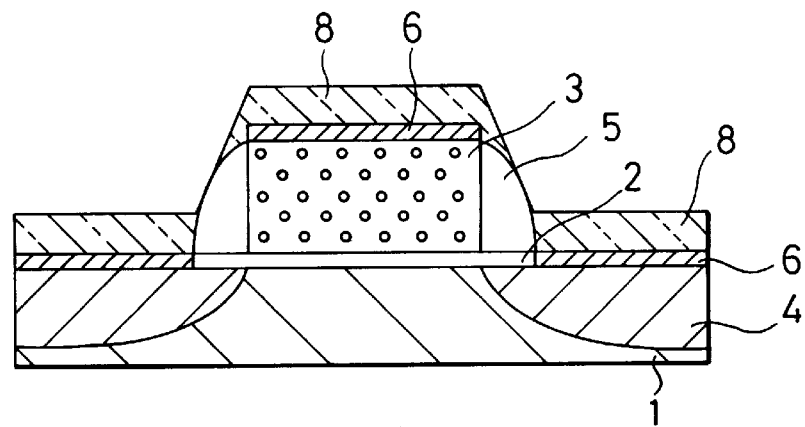
Figure 7A:
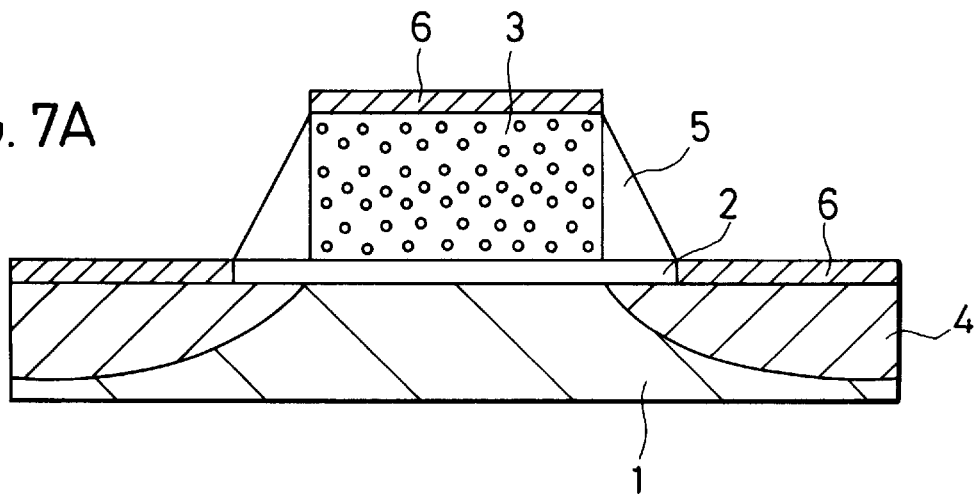
FIGS. 7A and 7B are cross-sectional views of a semiconductor device showing respective step of a method in accordance with a variant of the second embodiment of the present invention.

Then, the titanium film 6 deposited on the sidewall 5 is removed by bias ECR-CVD, which is a sort of plasma-enhanced CVD by which high frequency bias is applied to a substrate. The conditions for film deposition by bias ECR-CVD are the same as those of the first embodiment. Similarly to the first embodiment, when the film deposition rate is great, silicon dioxide films 8 are deposited on the flat portions of the silicon substrate 1, as illustrated in FIG. 6C. On the other hand, when the film deposition rate is small, the silicon dioxide film 8 is not deposited and the sidewall 5 is etched in a slope-shape, as illustrated in FIG. 7A.

Figure 6D:
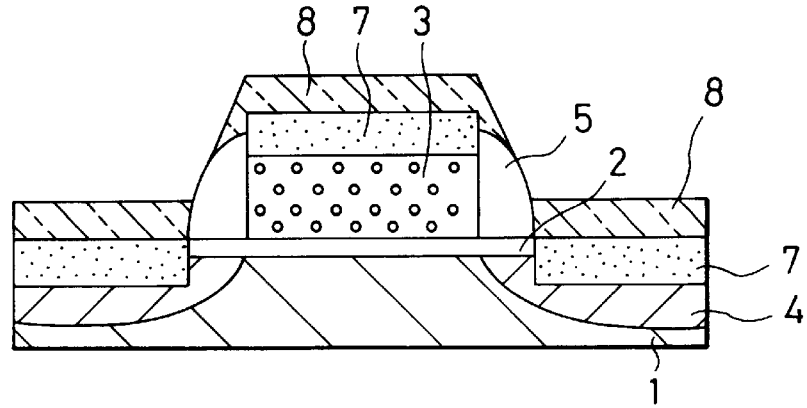
Figure 7B:
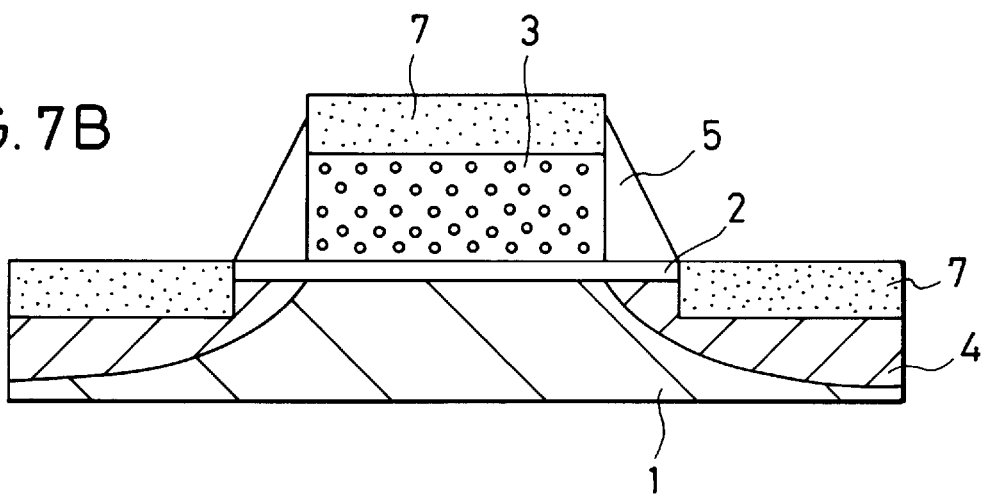

Then, a resultant is thermally treated at about 750° C. to thereby form titanium silicide films 7 only on the gate polysilicon film 3 and the source/drain diffusion layers 4, as illustrated in FIGS. 6D and 7B. Since no titanium exists on the sidewall 5 in either case (FIGS. 6C and 7A), a titanium silicide film is not deposited on the sidewall 5. Thus, it is possible to prevent occurrence of shortcircuits between the gate electrode 3 and the source/drain regions 4.

If the titanium film 6 partially remains unreacted on the sidewall 5, they are removed by wet etching.

Hereinbelow is described the third embodiment with reference to FIGS. 8A to 8D.

Figure 8A:
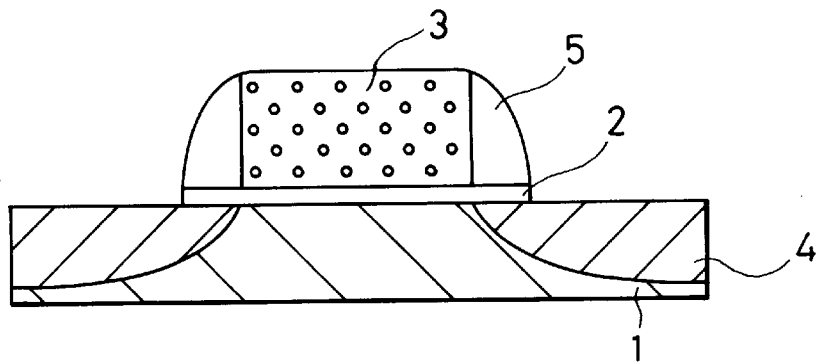
FIGS. 8A to 8D are cross-sectional views of a semiconductor device showing respective step of a method in accordance with the third embodiment of the present invention.
Figure 8B:
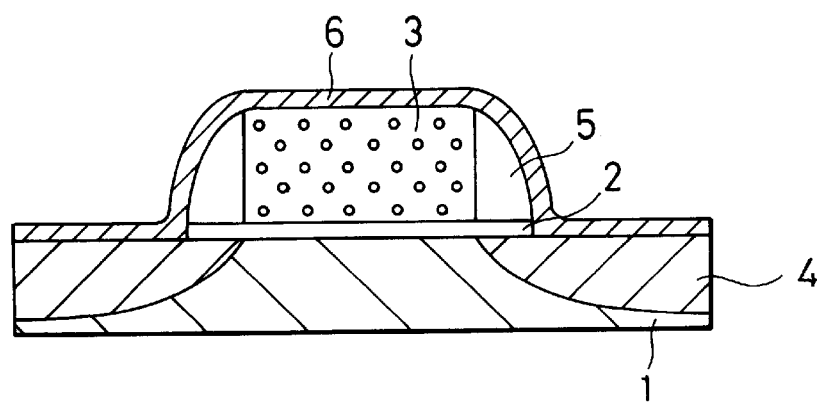

Similarly to the first embodiment, as illustrated in FIG. 8A, a gate polysilicon film 3 is first formed on a silicon substrate 1 with a gate insulating film 2 sandwiched therebetween. Then, n-type impurities are ion-implanted into the silicon substrate 1 at a small dose to thereby form a diffusion layer having low impurity concentration. Then, a silicon dioxide film is deposited all over the silicon substrate 1 by means of CVD. The silicon dioxide film is etched back by anisotropic RIE to thereby form a sidewall 5 around a side surface of the gate polysilicon film 3. Then, n-type impurities are ion-implanted into the silicon substrate 1 again to thereby form a diffusion layer having a high impurity concentration. The thus formed diffusion layer and the previously formed diffusion layer act as source and drain diffusion layers 4. The sidewall 5 electrically insulates the gate polysilicon film 3 from the source and drain diffusion layers 4. Then, a titanium film 6 is deposited all over a resultant by sputtering or CVD, as illustrated in Fig. SB.

Figure 8C:
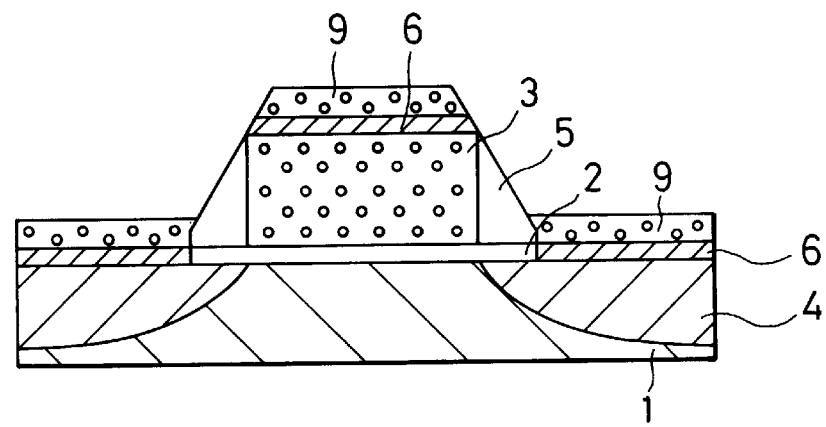

Then, the titanium film 6 deposited on the sidewall 5 is removed by bias ECR-CVD. By carrying out bias ECR-CVD, there are formed polysilicon films 9 on the gate polysilicon film 3 and the source/drain diffusion layers 4, as illustrated in FIG. 8C. The conditions for the film deposition by bias ECR-CVD are as follows.

silane flow rate: 15 to 25 sccm oxygen flow rate: 0 sccm argon flow rate: 70 to 100 sccm micro-waves output: 2000 kW high frequency bias output: 1400 kW film deposition temperature: 300° to 350° C.

Figure 8D:
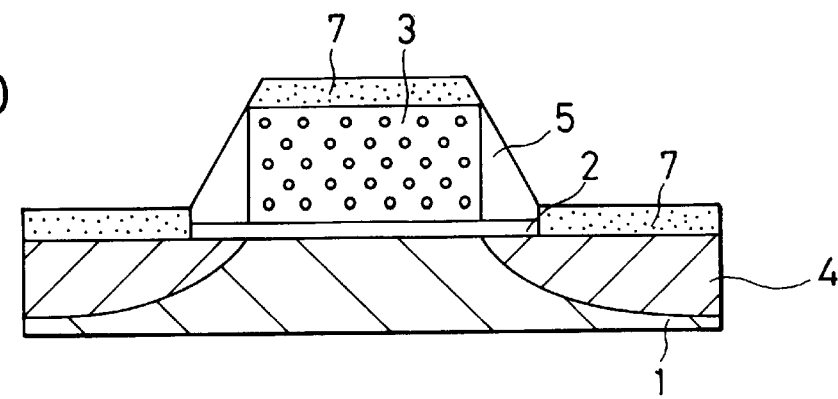

Then, the silicon substrate 1 is subject to thermal treatment. Silicon reacts with titanium on the gate polysilicon film 3 and the source/drain diffusion layers 4 to thereby form titanium silicide films 7, as illustrated in FIG. 8D. The titanium silicide film 7 is not deposited on the sidewall 5, because there exists no titanium on the sidewall 5. In addition, on the deposition of the titanium silicide films 7 on the gate polysilicon film 3 and the source/drain diffusion layers 4, silicon situated on titanium is diffused into titanium to thereby form titanium silicide. Thus, silicon contained in the gate polysilicon film 3 and the source/drain diffusion layers 4 is not allowed to diffuse into titanium, and hence it is possible to prevent the impurity concentration of the gate polysilicon film 3 and the impurities profile of the source/drain diffusion layers 4 from getting disordered.

If the titanium film 6 partially remains unreacted on the sidewall 5, they are removed by wet etching. If the polisilicon film partially remains unreacted on the sidewall 5, they are removed by chemical dry etching.

Hereinbelow is described the fourth embodiment of the present invention with reference to FIGS. 9A to 9C.

Figure 9A:
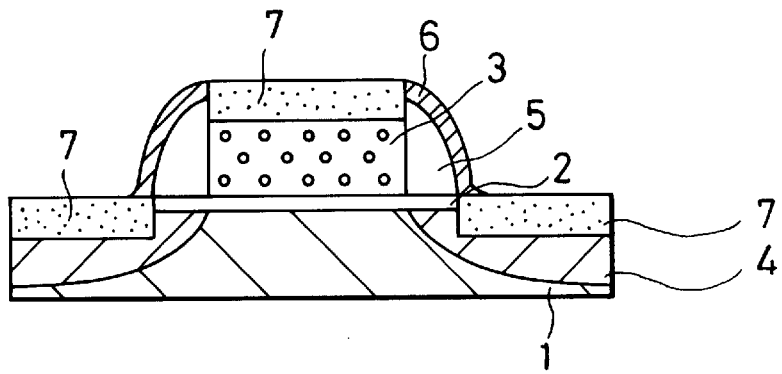
FIGS. 9A to 9C are cross-sectional views of a semiconductor device showing respective step of a method in accordance with the fourth embodiment of the present invention.

Similarly to the first embodiment, as illustrated in FIG. 9A, a gate polysilicon film 3 and a sidewall 5 are formed on a silicon substrate 1. Source and drain diffusion layers 4 are also formed in the substrate 1. The sidewall 5 electrically insulates the gate polysilicon film 3 from the source and drain diffusion layers 4. Then, a titanium film 6 is deposited all over a resultant by sputtering or CVD, followed by thermal treatment at about 750° C. to thereby selectively form titanium silicide films 7 only on the gate polysilicon film 3 and the source and drain diffusion layers 4, as illustrated in FIG. 9A.

Then, bias ECR-CVD is carried out under the same conditions as those of the first embodiment to thereby remove the titanium film 6 and quite a small amount of titanium silicide present below the titanium film 6.

Figure 9B:
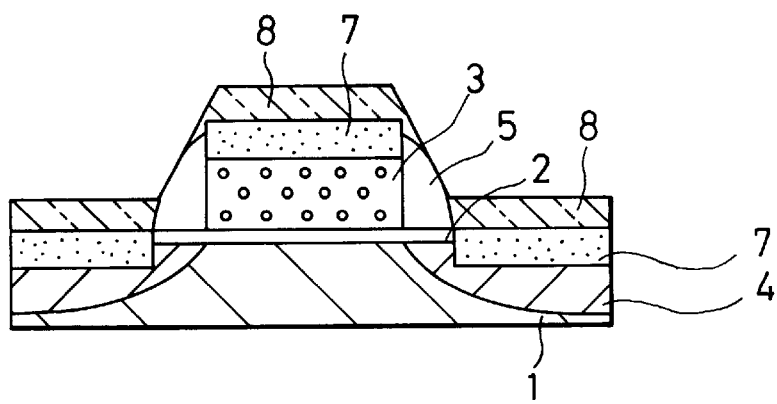
Figure 9C:
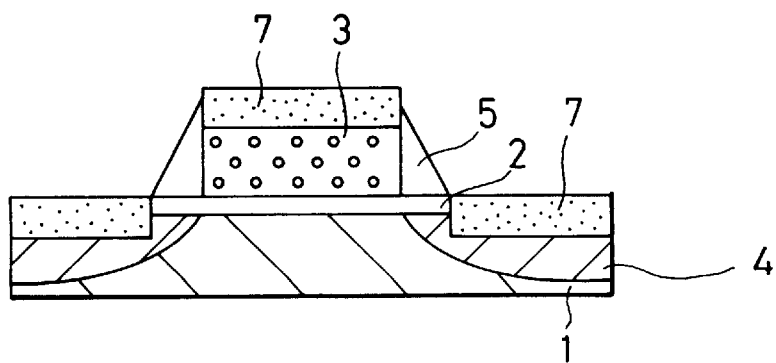

By carrying out bias ECR-CVD, silicon dioxide films 8 are deposited on the gate polysilicon film 3 and the source/drain diffusion layers 4, when the film deposition rate is sufficiently high, as illustrated in FIG. 9B. On the other hand, when the film deposition rate is equal to zero, there is deposited no silicon dioxide films 8, and the sidewall 5 is etched as illustrated in FIG. 9C.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, though the titanium film 6 is deposited in the above mentioned embodiments, refractory metals such as tungsten (W), tantalum (Ta) and molybdenum (Mo) may be used in place of titanium Ti for depositing a metal film from which a metal silicide film is to be made.

In addition, it should be noted that the present invention may be applied to a transistor having a single drain structure as well as a transistor having a LDD-structure.

What is claimed is:

1. A method of fabricating a semiconductor device, comprising the steps, in sequence, of:

(a) forming a metal film over a semiconductor substrate including a gate electrode on a surface thereof, an insulating sidewall covering a side surface of said gate electrode therewith, and source and drain regions formed therein;

(b) forming a metal silicide film both on said gate electrode and said source and drain regions by thermally treating said semiconductor substrate to cause said metal film to react with silicon;

(c) etching out a non-silicided portion of said metal film; and (d) removing a portion of said non-silicided portion remaining non-etched on said sidewall in said step (c), by means of plasma-enhanced chemical vapor deposition.

2. The method as set forth in claim 1, wherein silicon dioxide films are formed on both said gate electrode and said source and drain regions by said plasma-enhanced chemical vapor deposition in said step (d).

3. The method as set forth in claim 1, wherein high frequency electric field is applied to said semiconductor substrate during said plasma-enhanced chemical vapor deposition.

4. The method as set forth in claim 1, wherein electron cyclotron resonance chemical vapor deposition is carried out as said plasma-enhanced chemical vapor deposition for applying micro-waves to said semiconductor substrate.

5. The method as set forth in claim 1, wherein an inert gas as well as process gases is used for said plasma-enhanced chemical vapor deposition.

6. The method as set forth in claim 1, wherein said metal film is made of one of titanium (Ti), tantalum (ra), molybdenum (Mo), and tungsten (W).

7. A method of fabricating a semiconductor device, comprising the steps, in sequence, of:

(a) forming a metal film over a semiconductor substrate including a gate electrode on a surface thereof, an insulating sidewall covering a side surface of said gate electrode therewith, and source and drain regions formed therein;

(b) removing a portion of said metal film formed on said sidewall by means of plasma-enhanced chemical vapor deposition; and (c) forming a metal silicide film both on said gate electrode and said source and drain regions by thermally treating said semiconductor substrate to cause said metal film to react with silicon.

8. The method as set forth in claim 7 further comprising the step of (d) etching out a non-silicided portion of said metal film, if any, said step (d) being to be carried out subsequently to said step (c).

9. The method as set forth in claim 8, wherein silicide dioxide films are formed on both said gate electrode and said source and drain regions by said plasma-enhanced chemical vapor deposition in said step (d).

10. The method as set forth in claim 7, wherein high frequency electric field is applied to said semiconductor substrate during said plasma-enhanced chemical vapor deposition.

11. The method as set forth in claim 7, wherein electron cyclotron resonance chemical vapor deposition is carried out as said plasma-enhanced chemical vapor deposition for applying micro-waves to said semiconductor substrate.

12. The method as set forth in claim 7, wherein an inert gas as well as process gases is used for said plasma-enhanced chemical vapor deposition.

13. The method as set forth in claim 7, wherein said metal film is made of one of titanium (Ti), tantalum (Ta), molybdenum (Mo), and tungsten (W).

14. A method of fabricating a semiconductor device, comprising the steps, in sequence, of:
   (a) forming a metal film over a semiconductor substrate including a gate electrode on a surface thereof, an insulating sidewall covering a side surface of said gate electrode therewith, and source and drain regions formed therein;
   (b) forming a metal silicide film both on said gate electrode and said source and drain regions by thermally treating said semiconductor substrate to cause said metal film to react with silicon; and
   (c) removing a portion of said metal silicide film formed on said sidewall by means of plasma-enhanced chemical vapor deposition.

15. The method as set forth in claim 14 further comprising the step of (d) etching out a non-silicided portion of said metal film, if any, said step (d) being to be carried out subsequently to said step (c).

16. The method as set forth in claim 15, wherein silicon dioxide films are formed on both said gate electrode and said source and drain regions by said plasma-enhanced chemical vapor deposition in said step (d).

17. The method as set forth in claim 14, wherein high frequency electric field is applied to said semiconductor substrate during said plasma-enhanced chemical vapor deposition.

18. The method as set forth in claim 14, wherein electron cyclotron resonance chemical vapor deposition is carried out as said plasma-enhanced chemical vapor deposition for applying micro-waves to said semiconductor substrate.

19. The method as set forth in claim 14, wherein an inert gas as well as process gases is used for said plasma-enhanced chemical vapor deposition.

20. The method as set forth in claim 14, wherein said metal film is made of one of titanium (Ti), tantalum (Ta), molybdenum (Mo), and tungsten (W).

* * * * *